(12) United States Patent
Taniguchi et al.

(10) Patent No.: US 10,191,342 B2
(45) Date of Patent: Jan. 29, 2019

(54) DISPLAY PANEL

(71) Applicant: Sakai Display Products Corporation, Sakai-shi, Osaka (JP)

(72) Inventors: Yuko Taniguchi, Sakai (JP); Takuya Ohishi, Sakai (JP)

(73) Assignee: Sakai Display Products Corporation, Sakai-shi, Osaka (JP)

( * ) Notice: Subject to any disclaimer, the term of this patent is extended or adjusted under 35 U.S.C. 154(b) by 0 days.

(21) Appl. No.: 15/031,593

(22) PCT Filed: Oct. 23, 2014

(86) PCT No.: PCT/JP2014/078259
§ 371 (c)(1),
(2) Date: Apr. 22, 2016

(87) PCT Pub. No.: WO2015/064477
PCT Pub. Date: May 7, 2015

(65) Prior Publication Data
US 2016/0259222 A1   Sep. 8, 2016

(30) Foreign Application Priority Data

Oct. 30, 2013 (JP) .................................. 2013-225808

(51) Int. Cl.
| | |
|---|---|
| *H01L 27/12* | (2006.01) |
| *G02F 1/1362* | (2006.01) |
| *G02F 1/1333* | (2006.01) |
| *G02F 1/1343* | (2006.01) |
| *G02F 1/1368* | (2006.01) |

(52) U.S. Cl.
CPC ...... *G02F 1/136259* (2013.01); *G02F 1/1368* (2013.01); *G02F 1/133345* (2013.01);
(Continued)

(58) Field of Classification Search
CPC ......... G02F 1/136259; G02F 1/136286; G02F 1/1368; G02F 1/134336; G02F 1/133345;
(Continued)

(56) References Cited

U.S. PATENT DOCUMENTS

| | | | | |
|---|---|---|---|---|
| 6,023,310 | A * | 2/2000 | Kawamoto | ........... G02F 1/1345 349/139 |
| 6,049,132 | A * | 4/2000 | Iwahashi | ........... G02F 1/136227 257/750 |

(Continued)

FOREIGN PATENT DOCUMENTS

| | | |
|---|---|---|
| JP | H9-160075 A | 6/1997 |
| JP | 2002-23132 A | 1/2002 |

(Continued)

*Primary Examiner* — Cuong Q Nguyen
(74) *Attorney, Agent, or Firm* — Rudy J. Ng; Bret E. Field; Bozicevic, Field & Francis LLP

(57) ABSTRACT

According to the display panel, when a disconnection occurs in a first auxiliary capacitor wiring at a location outside from the outermost wiring among the plurality of second auxiliary capacitor wirings of an active area, the first auxiliary capacitor wiring and an auxiliary capacitor spare wiring are short-circuited at an overlapped portion A, and the auxiliary capacitor spare wiring and a normal first auxiliary capacitor wiring are short-circuited at an overlapped portion B, such that a path is formed through which a signal is transmitted by bypassing the location of the disconnection.

11 Claims, 17 Drawing Sheets

(52) U.S. Cl.
CPC .. *G02F 1/134336* (2013.01); *G02F 1/136213* (2013.01); *G02F 1/136286* (2013.01); *H01L 27/1244* (2013.01); *H01L 27/1255* (2013.01); *G02F 2001/136263* (2013.01); *G02F 2001/136272* (2013.01)

(58) Field of Classification Search
CPC ... G02F 1/136213; G02F 2001/136272; G02F 2001/136263; H01L 27/1255; H01L 27/1244; H01L 27/3272; H01L 27/3244
See application file for complete search history.

(56) References Cited

U.S. PATENT DOCUMENTS

| | | | |
|---|---|---|---|
| 2001/0019128 A1* | 9/2001 | Kubota | G09G 3/3688 257/72 |
| 2001/0028429 A1* | 10/2001 | Wu | G02F 1/1309 349/139 |
| 2002/0174539 A1* | 11/2002 | Kanayama | G02F 1/136259 29/852 |
| 2004/0113190 A1* | 6/2004 | Oh | H01L 21/76801 257/296 |
| 2006/0103024 A1* | 5/2006 | Salmon | H01L 21/4857 257/758 |
| 2008/0062108 A1 | 3/2008 | Kim | |

FOREIGN PATENT DOCUMENTS

| | | |
|---|---|---|
| JP | 2003-23948 A | 2/2003 |
| JP | 2003-43948 A | 2/2003 |
| JP | 2005-534974 A | 11/2005 |
| JP | 2008-65334 A | 3/2008 |
| JP | 2010-271413 A | 12/2010 |
| WO | WO2012005038 A1 | 1/2012 |

* cited by examiner

F I G. 8
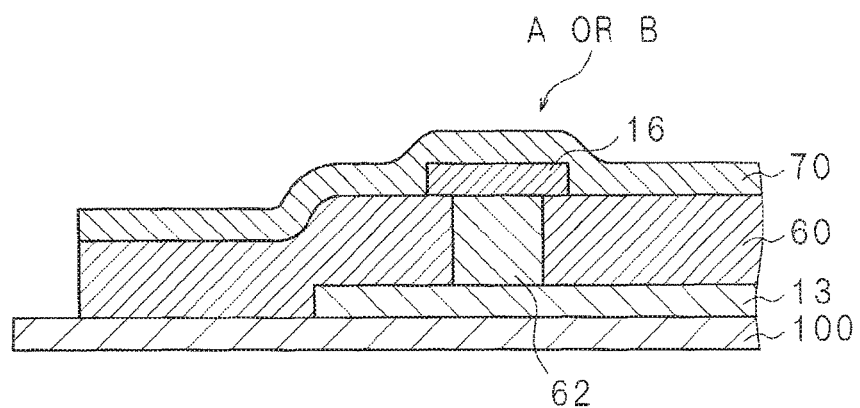

DISPLAY PANEL

CROSS-REFERENCE TO RELATED APPLICATIONS

This application is the national phase under 35 U. S. C. § 371 of PCT International Application No. PCT/JP2014/078259 which has an International filing date of Oct. 23, 2014 and designated the United States of America.

FIELD

The present invention relates to a display panel which comprises a spare wiring for auxiliary capacitor wirings supplying a signal to auxiliary capacitors of pixel electrodes.

BACKGROUND

A typical active matrix type liquid crystal display panel comprises a thin film transistor (TFT) substrate on which pixel electrodes arranged in the form of a matrix and TFTs operating as switching elements are formed, and an opposite substrate disposed opposite to the TFT substrate at a predetermined interval, wherein a liquid crystal is filled between both substrates.

The liquid crystal display panel is further provided with two polarizing filters which sandwich the TFT substrate and the opposite substrate. In addition, the liquid crystal display panel is provided with a backlight adjacent thereto. By changing a voltage applied to the liquid crystal, an alignment direction of liquid crystal molecules between the substrates is changed, such that an amount of light transmitting through the two polarizing filters may be controlled, and any image may be displayed.

Each pixel electrode is connected with a drain electrode of each TFT, which operates as the switching element for controlling a voltage of the pixel electrode. A gate electrode of each TFT is connected with a predetermined gate wiring for supplying a gate signal, and a source electrode thereof is connected with a predetermined source wiring for supplying a data signal.

On the TFT substrate, an area in which the pixel electrodes are formed in the form of a matrix is referred to as an active area, and an area which surrounds the active area is referred to as a frame area. In the frame area, the source wiring and the gate wiring are respectively drawn out from the active area, and each wiring is connected to a driver IC. The driver IC connected to the source wiring is referred to as a source driver, and the driver IC connected to the gate wiring is referred to as a gate driver.

A data signal is input to each pixel electrode at a predetermined time interval. Therefore, the pixel electrodes are respectively connected with auxiliary capacitors for stably holding the input data signal until the next input, and auxiliary capacitor wirings for supplying a signal to the auxiliary capacitors are arranged on the TFT substrate. When the auxiliary capacitor wirings are arranged on the TFT substrate, generally, a predetermined number of auxiliary capacitor wirings are arranged at a predetermined interval in parallel to the gate wirings between a predetermined number of gate wirings which are arranged in parallel to each other. Further, a stem line for the auxiliary capacitor wirings for distributing signals to the auxiliary capacitor wirings is connected to the auxiliary capacitor wirings. The stem line for the auxiliary capacitor wirings is connected to a voltage applying circuit, such that a voltage is applied to the auxiliary capacitor wirings through the stem line for the auxiliary capacitor wirings, and a signal is applied to the auxiliary capacitor of each pixel electrode.

SUMMARY

In a manufacturing process of the TFT substrate as described above, the TFT substrate may be formed while a disconnection occurs in the auxiliary capacitor wiring or the stem line for the auxiliary capacitor wirings which are arranged on the substrate. In such a case, an auxiliary capacitor signal is not supplied to the auxiliary capacitors of the pixel electrodes downstream from a disconnection location in a direction in which a signal is transmitted. As a result, a display defect may appear on the display panel.

If a display defect appears, a display quality of the display panel is significantly deteriorated. In addition, since the display panel that incorporates the display defect becomes a defective product, a decrease in yield of the product may occur.

As a configuration capable of correcting the display defect caused by a disconnection occurring in the auxiliary capacitor wiring or the stem line for the auxiliary capacitor wirings on the TFT substrate, Japanese Patent Application Laid-Open No. 2010-271413 discloses a configuration of a TFT substrate which may form an alternative path bypassing a disconnection location, by providing a spare wiring in the frame area.

In the configuration illustrated in Japanese Patent Application Laid-Open No. 2010-271413, when the disconnection is formed in the auxiliary capacitor wiring, the spare wiring, the auxiliary capacitor wiring in which the disconnection is formed, and a normal auxiliary capacitor wiring are short-circuited, such that an alternative path bypassing the disconnection location is formed, and thereby an auxiliary capacitor signal may be accurately supplied to the auxiliary capacitors of the pixel electrodes. In addition, when the disconnection is formed in the stem line for the auxiliary capacitor wirings, the spare wiring, the auxiliary capacitor wiring which is connected to the stem line for the auxiliary capacitor wirings on an upstream from the disconnection location, and the auxiliary capacitor wiring which is connected to the stem line for the auxiliary capacitor wirings on the downstream from the disconnection location are connected, such that an alternative path bypassing the disconnection location is formed, and thereby an auxiliary capacitor signal may be accurately supplied to the auxiliary capacitors of the pixel electrodes.

However, in the configuration described in Japanese Patent Application Laid-Open No. 2010-271413, a case capable of correcting the display defect is limited to the case in which the disconnection location is present in the frame area, and when the disconnection location is present in the active area, the display defect may not be corrected.

In consideration of the above-mentioned circumstances, it is an object of the present invention to provide a display panel in which, when a disconnection is formed in an auxiliary capacitor wiring within an active area, a display defect caused by the disconnection may be corrected.

A display panel according to one embodiment of the present invention is a display panel comprising: a substrate; a plurality of pixel electrodes which are disposed on the substrate in the form of a matrix, and are configured to display an image; a plurality of capacitor parts, each of which is connected from one end of one of the capacitor parts to one of the plurality of the pixel electrodes; a plurality of first wirings, which are arranged on the substrate along a first direction of the matrix, and each of which is connected to the other end of the one of the capacitor parts; a plurality of second wirings, which are arranged on the substrate along a second direction crossing the first direction, and each of which is connected with the predetermined first wirings; a third wiring, which is arranged on the substrate along the first direction, and is connected with the predetermined second wirings to supply a predetermined signal to the plurality of first wirings through the predetermined second wirings; a fourth wiring, which is arranged on the substrate along the second direction, and is overlapped on the plurality of first wirings; and an insulating film configured to insulate the fourth wiring from the first wirings.

According to the display panel of the embodiment, the plurality of pixel electrodes for displaying an image are disposed on the substrate in the form of a matrix, and one end of each of the capacitor parts is connected to one of the pixel electrodes. The plurality of first wirings are arranged on the substrate along the first direction of the matrix, and each of the first wirings is connected to the other end of the one of the capacitor parts. The second wirings are arranged on the substrate along the second direction crossing the first direction, and are connected to the first wirings. The third wiring is arranged on the substrate along the first direction, and is connected with the predetermined second wirings to supply a signal to the first wirings through the second wirings, so as to apply a voltage to the capacitor parts. The fourth wiring is arranged on the substrate along the second direction, and is overlapped on the first wirings with the insulating film interposed therebetween. When the first wiring is disconnected, a signal may not be normally supplied to a part of the capacitor parts depending on a disconnection location. In this case, the first wiring having the disconnection and the fourth wiring, as well as the fourth wiring and a normal first wiring which transmits the same signal as the first wiring having the disconnection are short-circuited, such that it is possible to form an alternative path bypassing the disconnection location. Therefore, a defect in transmission of a signal caused by the disconnection of the first wiring may be corrected.

In the display panel according to the embodiment of the present invention, the plurality of second wirings may be connected to the first wirings within an area in which the plurality of pixel electrodes are arranged.

According to the display panel of the embodiment, the plurality of second wirings are connected to the first wirings within the area in which the plurality of pixel electrodes are arranged, that is, an active area. Therefore, since the plurality of second wirings may be arranged within the active area to be connected with the first wirings, even if the wiring is disconnected within the active area, it is possible to provide a redundancy in transmittance of the signal to a circuit without being affected by the disconnection.

In the display panel according to the embodiment of the present invention, the third wiring may be disposed in a peripheral area surrounding an area in which the plurality of pixel electrodes are arranged.

According to the display panel of the embodiment, the third wiring is disposed in the peripheral area surrounding the active area, that is, a frame area. Therefore, wirings within the active area may be simplified.

In the display panel according to the embodiment of the present invention, the fourth wiring may be disposed in a peripheral area surrounding an area in which the plurality of pixel electrodes are arranged.

According to the display panel of the embodiment, the fourth wiring is disposed in the frame area. Therefore, when the first wiring is disconnected at a location outside from the outermost wiring among the plurality of second wirings within the active area, the defect in transmission of a signal caused by the disconnection may be corrected.

In the display panel according to the embodiment of the present invention, the plurality of second wirings may be respectively connected to a part of the first wirings, and a plurality of the third wirings are arranged, and are respectively connected to a part of the second wirings.

According to the display panel of the embodiment, the plurality of second wirings are respectively connected to a part of the plurality of first wirings. The plurality of third wirings are arranged, and are respectively connected to a part of the plurality of second wirings electrically. Therefore, the entire wirings and the plurality of capacitor parts are divided into different input systems, and different signals may be applied to the capacitor parts pertained to the different input systems.

In the display panel according to the embodiment of the present invention, the plurality of first wirings and the third wiring may be formed in the same layer, the plurality of second wirings and the fourth wiring may be formed in the same layer, and the layer in which the plurality of first wirings and the third wiring are formed, and the layer in which the plurality of second wirings and the fourth wiring are formed may be isolated by the insulating film.

According to the display panel of the embodiment, the first wirings and the third wiring are formed in the same layer. The second wirings and the fourth wiring are formed in the same layer. The respective layers are isolated from each other by the insulating film. Therefore, the wirings arranged in parallel to each other are formed in the same layer, such that there is no need to laminate a plurality of layers on the substrate, and the number of processes for forming the substrate may be reduced.

In the display panel according to the embodiment of the present invention, the plurality of second wirings may be overlapped on the plurality of first wirings and the third wiring, and may be respectively connected thereto through contact holes formed in the insulating film at overlapped portions.

According to the display panel of the embodiment, the second wirings are overlapped on the first wirings and the third wiring. The second wirings are connected to the first wirings and the third wiring through the contact holes formed in the insulating film at the overlapped portions. Therefore, the wirings are appropriately insulated by the insulating film, so that predetermined wirings are connected to each other, and the other wirings are not unnecessarily connected.

In the display panel according to the embodiment of the present invention, the fourth wiring may be overlapped on the third wiring with the insulating film interposed therebetween in a peripheral area surrounding an area in which the plurality of pixel electrodes are arranged.

According to the display panel of the embodiment, the fourth wiring is overlapped on the third wiring with the insulating film interposed therebetween in the frame area. Therefore, when the first wiring is disconnected at the location outside from the outermost wiring among the plurality of second wirings within the active area, the first wiring having the disconnection and the fourth wiring, as well as the fourth wiring and a normal third wiring which transmits the same signal as the first wiring having the disconnection are short-circuited, such that it is possible to form an alternative path bypassing the disconnection location, and correct the defect in transmission of a signal caused by the disconnection.

In the display panel according to the present invention, the fourth wiring may be divided into a plurality of segments.

According to the display panel of the embodiment, the fourth wiring is divided into a plurality of segments. Therefore, since one fourth wiring may cope with the correction of a plurality of disconnection locations, it is possible to reduce the number of the fourth wirings to be arranged, and reduce a wiring space.

The display panel according to the embodiment of the present invention may comprise: transistors of which drain electrodes are connected to the plurality of pixel electrodes, respectively; a plurality of gate wirings which are arranged along the first direction, and are respectively connected to gate electrodes of the transistors to supply a gate signal; and a plurality of source wirings which are arranged along the second direction, and are respectively connected to source electrodes of the transistors to supply a data signal.

According to the display panel of the embodiment, the transistors of which the drain electrodes are respectively connected to the plurality of pixel electrodes perform switching control on a signal input to the pixel electrodes. The gate wirings, which are arranged along the first direction and are respectively connected to the gate electrodes of the transistors, supply a gate signal relating to the switching. The source wirings, which are arranged along the second direction and are respectively connected to the source electrodes of the transistors, supply a source signal to the pixel electrodes. Therefore, it is possible to turn on the transistor by inputting the gate signal thereto, and supply the signal to the pixel electrode connected to the turned on transistor by a data signal. Thereby, it is possible to input any signal to each of the pixel electrodes by the gate wirings and the source wirings.

In the display panel according to the embodiment of the present invention, the plurality of gate wirings may be formed in the same layer as the layer in which the plurality of first wirings and the third wiring are formed, and the plurality of source wirings may be formed in the same layer as the layer in which the plurality of second wirings and the fourth wiring are formed.

According to the display panel of the embodiment, the gate wirings are formed in the same layer as the layer in which the first wirings and the third wiring are formed. The source wirings are formed in the same layer as the layer in which the second wirings and the fourth wiring are formed. Therefore, the wirings arranged in parallel to each other are formed in the same layer, such that there is no need to laminate a plurality of layers on the substrate, and the number of processes for forming the substrate may be reduced.

According to the present invention, it is possible to provide a display panel capable of, when the disconnection occurs in the auxiliary capacitor wiring within the active area, correcting the display defect caused by the disconnection.

The above and further objects and features will more fully be apparent from the following detailed description with accompanying drawings.

BRIEF DESCRIPTION OF THE DRAWINGS

FIG. 8 is a cross-sectional view taken on line VIII-VIII of FIG. 7, which illustrates a method of short-circuiting the wirings.

DETAILED DESCRIPTION

Hereinafter, the present invention will be described in detail with reference to the accompanying drawings illustrating embodiments thereof.

Embodiment 1

Figure 1:
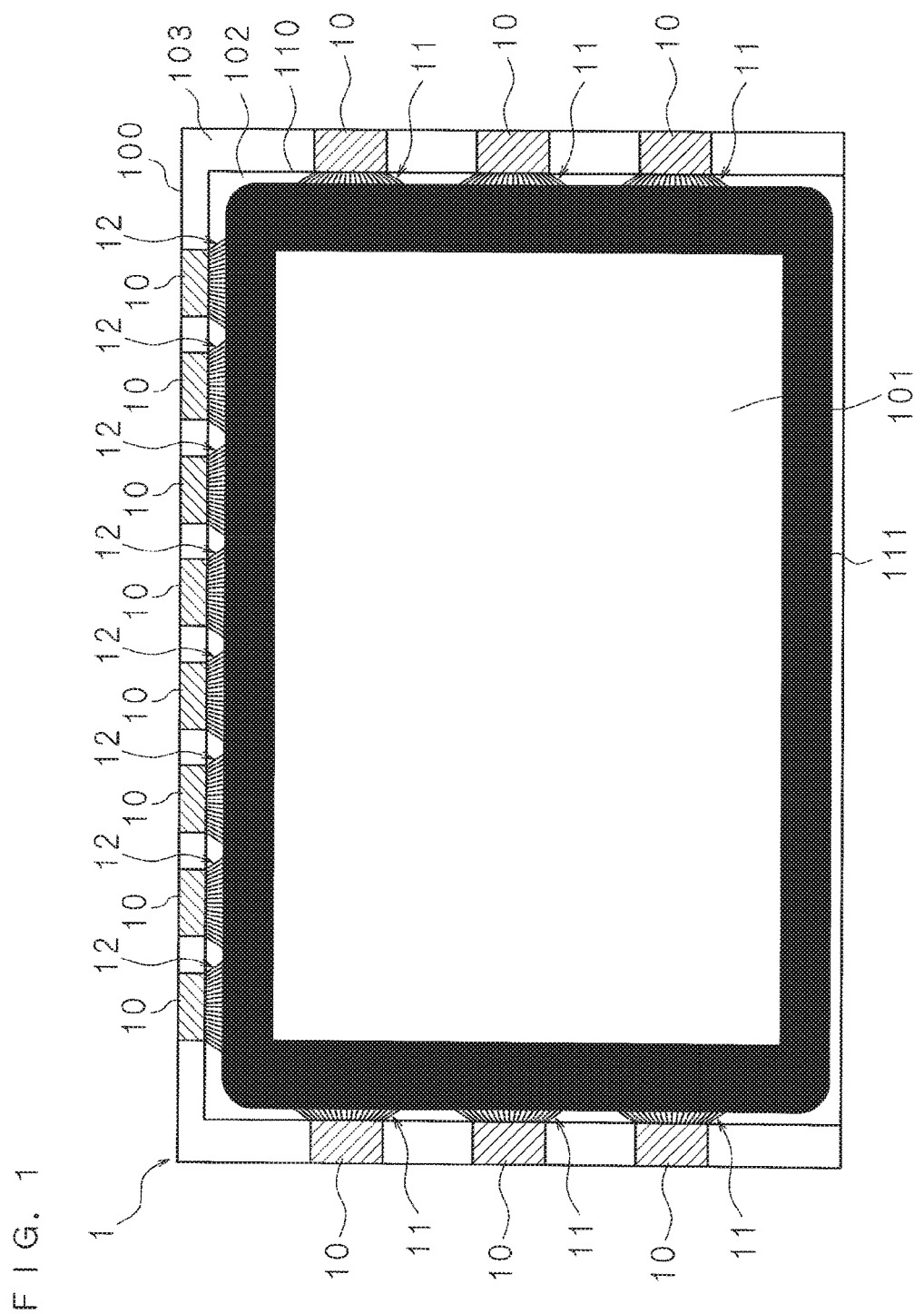
FIG. 1 is a view conceptually illustrating a display panel according to an embodiment of the present invention.
Figure 2:
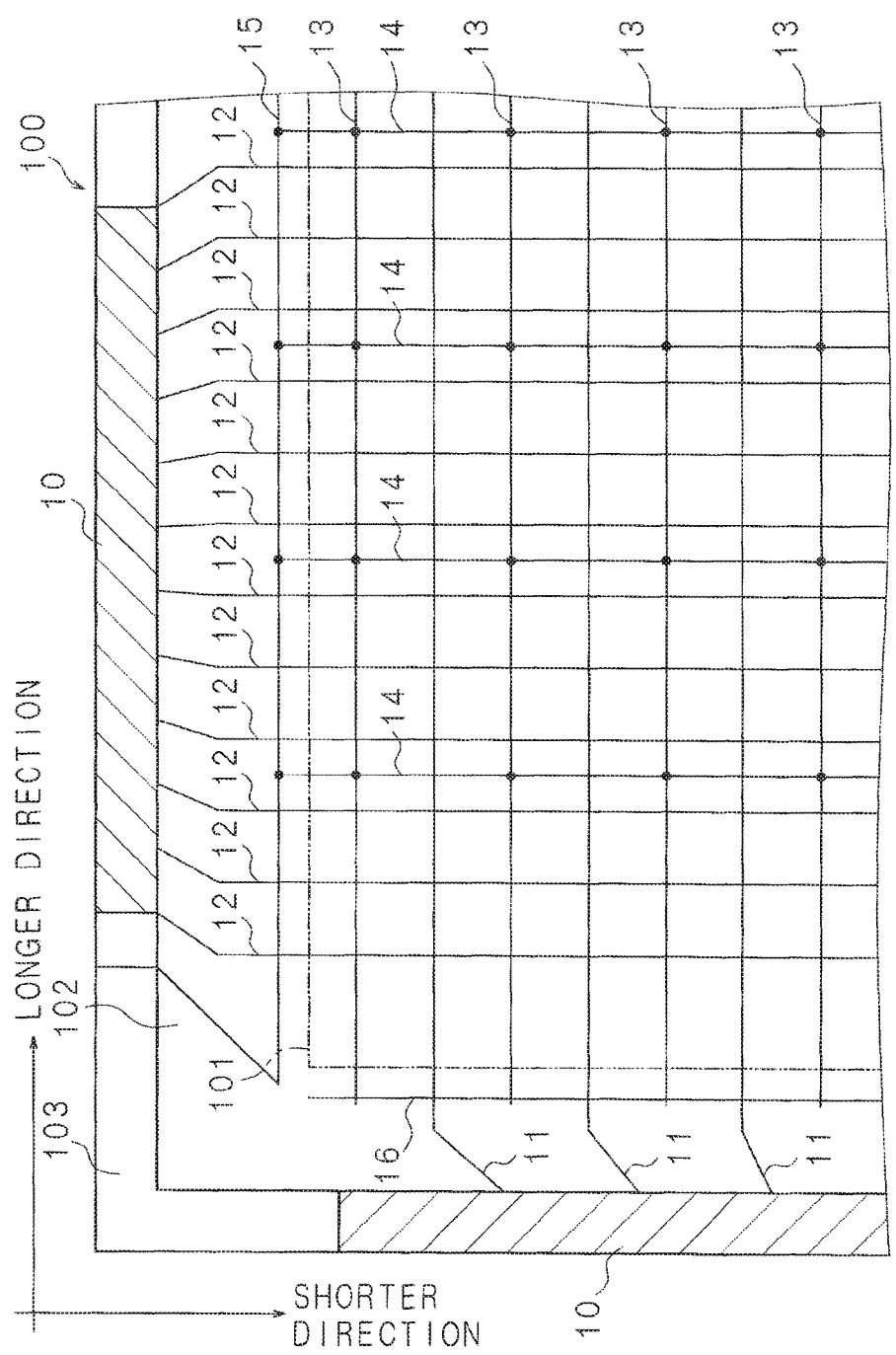
FIG. 2 is a schematic view illustrating wirings by enlarging a part of an area of a TFT substrate according to the embodiment of the present invention.
Figure 3:
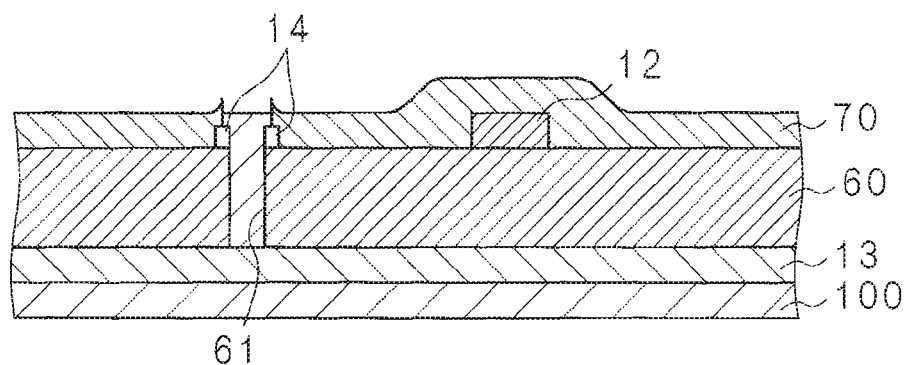
FIG. 3 is a cross-sectional view illustrating a portion in which the wirings are electrically connected to each other on the TFT substrate.
Figure 4:
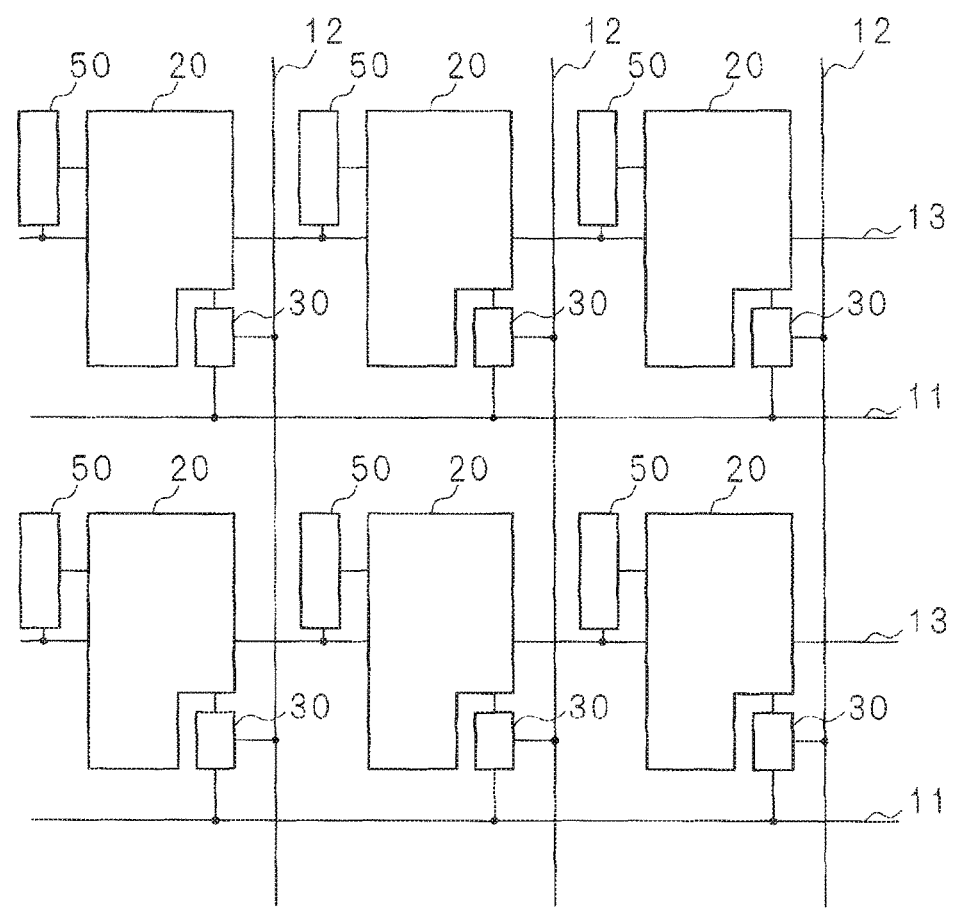
FIG. 4 is a schematic view illustrating pixel electrodes and each wiring on the TFT substrate.
Figure 5:
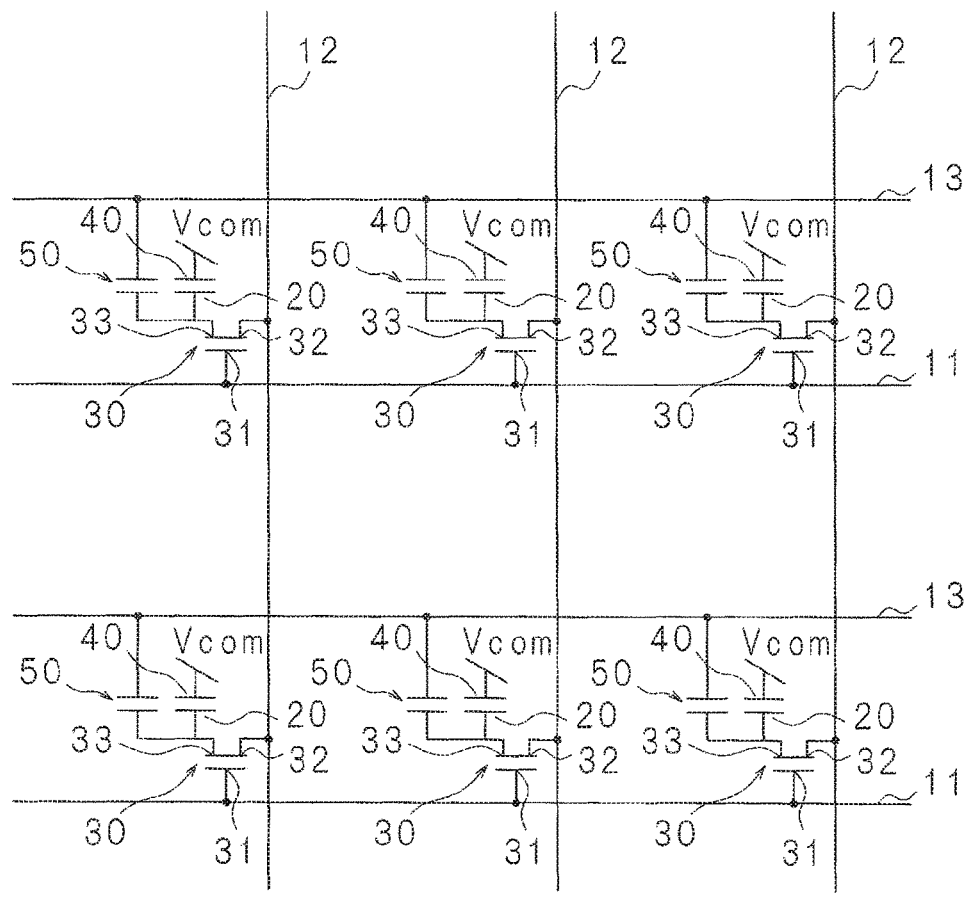
FIG. 5 is a circuit diagram illustrating an equivalent circuit of FIG. 4.

FIG. 1 is a view conceptually illustrating a display panel 1 according to an embodiment of the present invention, and illustrates a TFT substrate 100 and an opposite substrate 110. In the present disclosure, when a viewer faces the display panel 1 as illustrated in FIG. 1, upper, lower, left and right sides are referred to as an upper side, a lower side, a left side and a right side, respectively. FIG. 2 is a schematic view illustrating wirings by enlarging a part of an area of the TFT substrate 100. FIG. 3 is a cross-sectional view illustrating a portion in which the wirings are electrically connected to each other. FIG. 4 is a schematic view illustrating pixel electrodes and each wiring on the TFT substrate 100. FIG. 5 is a circuit diagram illustrating an equivalent circuit of FIG. 4.

The TFT substrate 100 is a light-transmitting rectangular substrate, and has a slightly larger area than that of the opposite substrate 110. The TFT substrate 100 is generally made of glass. The TFT substrate 100 includes pixel electrodes 20 respectively corresponding to a plurality of display pixels arranged in the form of a matrix, and TFTs 30. Each pixel electrode 20 is connected with a drain electrode 33 of each TFT 30. An area 101 in which the pixel electrodes 20 are arranged in the matrix on the TFT substrate 100 is referred to as an active area. In addition, an area 102 which surrounds the active area 101 is referred to as a frame area. Further, the TFT substrate 100 is provided with a terminal area 103 at a peripheral edge part thereof, and the terminal area 103 is provided with a plurality of connection terminals 10 which are respectively connected with gate wirings 11 for supplying a gate signal to gate electrodes 31 of the TFTs 30 connected to each pixel or source wirings 12 for supplying a data signal to source electrodes 32 thereof.

A data signal to be supplied to the source electrodes 32 is input to the connection terminals 10 arranged along the upper side of the display panel 1 from a driver IC (not illustrated). The driver IC which generates the data signal is referred to as a source driver. The data signal is input to each source electrode 32 through the source wirings 12 drawn out from the connection terminals 10.

Similarly, a gate signal to be supplied to each gate electrode 31 is input to the connection terminals 10 arranged along the left side or right side of the display panel 1 from a driver IC. The driver IC which generates the gate signal is referred to as a gate driver. The gate signal is input to each gate electrode 31 through the gate wirings 11 drawn out from the connection terminals 10.

The opposite substrate 110 is a light-transmitting rectangular substrate, and is disposed opposite to one surface of the TFT substrate 100 at a predetermined interval. The opposite substrate 110 is also generally made of glass. The opposite substrate 110 includes common electrodes 40 (FIG. 5) which are formed on a surface thereof opposite to the TFT substrate and are applied with a voltage between each common electrode 40 and each pixel electrode 20. In addition to these components, the opposite substrate 110 is provided with a light shielding part 111 which shields light in an area around the display area.

The TFT substrate 100 and the opposite substrate 110 are bonded to each other by a seal material while being provided with a void between both substrates, and by sealing a liquid crystal material into the void, a liquid crystal layer is formed.

In addition to these components, the display panel 1 also comprises various components, but the components which are not directly related to the present invention will not be described.

As illustrated in FIG. 2, the gate wirings 11 and the source wirings 12 drawn out from the connection terminals 10 are arranged on the TFT substrate 100. The plurality of gate wirings 11 are arranged in parallel to each other along a longer direction of the TFT substrate 100 (a first direction described in the claims), and the plurality of source wirings 12 are arranged in parallel to each other along a shorter direction of the TFT substrate 100 (a second direction described in the claims).

Further, each pixel electrode 20 is connected with one end of an auxiliary capacitor 50. The other ends of the auxiliary capacitors 50 are respectively connected with a plurality of first auxiliary capacitor wirings 13 (first wirings described in the claims) which are arranged in parallel to each other along the longer direction, and supply predetermined auxiliary capacitor signals. In addition, a plurality of second auxiliary capacitor wirings 14 are arranged in parallel to each other on the substrate along the shorter direction, which supply predetermined auxiliary capacitor signals to the first auxiliary capacitor wirings 13, and are overlapped with the first auxiliary capacitor wirings 13 while crossing the first auxiliary capacitor wirings 13 within the display area.

One stem line 15 for the auxiliary capacitor wirings (a third wiring described in the claims) is arranged in the frame area 102 of the TFT substrate 100 along the longer direction by drawing out from the terminal area 103 on the peripheral edge along the longer direction. The stem line 15 for the auxiliary capacitor wirings has portions overlapped with all the second auxiliary capacitor wirings 14.

The gate wirings 11, the first auxiliary capacitor wirings 13, and the stem line 15 for the auxiliary capacitor wirings are arranged in parallel to each other in the same layer on the TFT substrate 100. An insulating film 60 (FIG. 3) is formed on the TFT substrate so as to cover the layer in which the gate wirings 11, the first auxiliary capacitor wirings 13, and the stem line 15 for the auxiliary capacitor wirings are arranged. The source wirings 12 and the second auxiliary capacitor wirings 14 are arranged in parallel to each other in the same layer on the insulating film 60.

The gate wiring 11 is insulated from the source wiring 12 and the second auxiliary capacitor wiring 14 by the insulating film 60. Compared with this, as illustrated in FIG. 3, the first auxiliary capacitor wiring 13 is insulated from the source wiring 12, while is connected with the second auxiliary capacitor wiring 14 through a contact hole 61 formed in the insulating film 60 at all portions overlapped with the second auxiliary capacitor wirings 14. The contact hole 61 is filled with a conductor. Further, a protective film 70 is formed on the insulating film. In addition, in FIG. 3, components other than the components required for illustrating the connection of the wirings are not illustrated. The stem line 15 for the auxiliary capacitor wirings is also, by the same configuration as FIG. 3, insulated from the source wiring 12, while is connected with the second auxiliary capacitor wirings 14 through the contact hole 61 at all portions overlapped with the second auxiliary capacitor wirings 14.

Further, in the frame area 102, an auxiliary capacitor spare wiring 16 (a fourth wiring described in the claims) is arranged along the shorter direction in the same layer as the layer in which the source wirings 12 and the second auxiliary capacitor wirings 14 are arranged. The auxiliary capacitor spare wiring 16 has portions overlapped with all the first auxiliary capacitor wirings 13. The auxiliary capacitor spare wiring 16 is not connected to any other wiring, and is formed in an electrical floating island-state. Further, FIG. 2 illustrates only the auxiliary capacitor spare wiring 16 arranged on a left side of the TFT substrate 100, but this wire is also arranged on a right side thereof. Hereinafter, these are the same in all the embodiments.

As illustrated in FIGS. 4 and 5, each pixel electrode 20 is connected with the drain electrode 33 of the TFT 30. The gate electrode 31 of the TFT 30 is connected with the gate wiring 11, and the source electrode 32 thereof is connected with the source wiring 12. One common electrode 40 is opposite to each pixel electrode 20, and is applied with a voltage between the common electrode 40 and the pixel electrodes 20. A potential of the common electrode 40 is uniform regardless of the position, and is represented by Vcom.

The gate signal generated by the gate driver is input to the gate electrode 31 of each TFT 30 through the gate wiring 11 to turn on each TFT 30. The data signal generated by the source driver is input to the turned on source electrode 32 of the TFT 30 through the source wiring 12, and any voltage is applied between each pixel electrode 20 and the common electrode 40. By controlling the voltage between the pixel electrode 20 and the common electrode 40, an alignment direction of the liquid crystal molecules between electrodes is controlled, and any image may be displayed on the display panel 1.

The auxiliary capacitor 50 is connected with the first auxiliary capacitor wiring 13, and to the auxiliary capacitor 50 a predetermined auxiliary capacitor signal is input. When the predetermined auxiliary capacitor signal is input to the auxiliary capacitor 50, each pixel electrode 20 may continuously hold the data signal until the next input after the data signal is input. Therefore, the image may be continuously displayed for a predetermined time.

In a manufacturing process of the TFT substrate 100, if a wiring which transmits the auxiliary capacitor signal is disconnected, a predetermined auxiliary capacitor signal may be not accurately input to a part of the auxiliary capacitors 50 depending on a disconnection location. In this case, the pixel electrode 20 connected to the auxiliary capacitor 50 may not continuously hold the data signal, and this portion appears as a display defect on the display panel 1. Therefore, in order to correct the display defect, it is necessary to correct a wiring.

Figure 6:
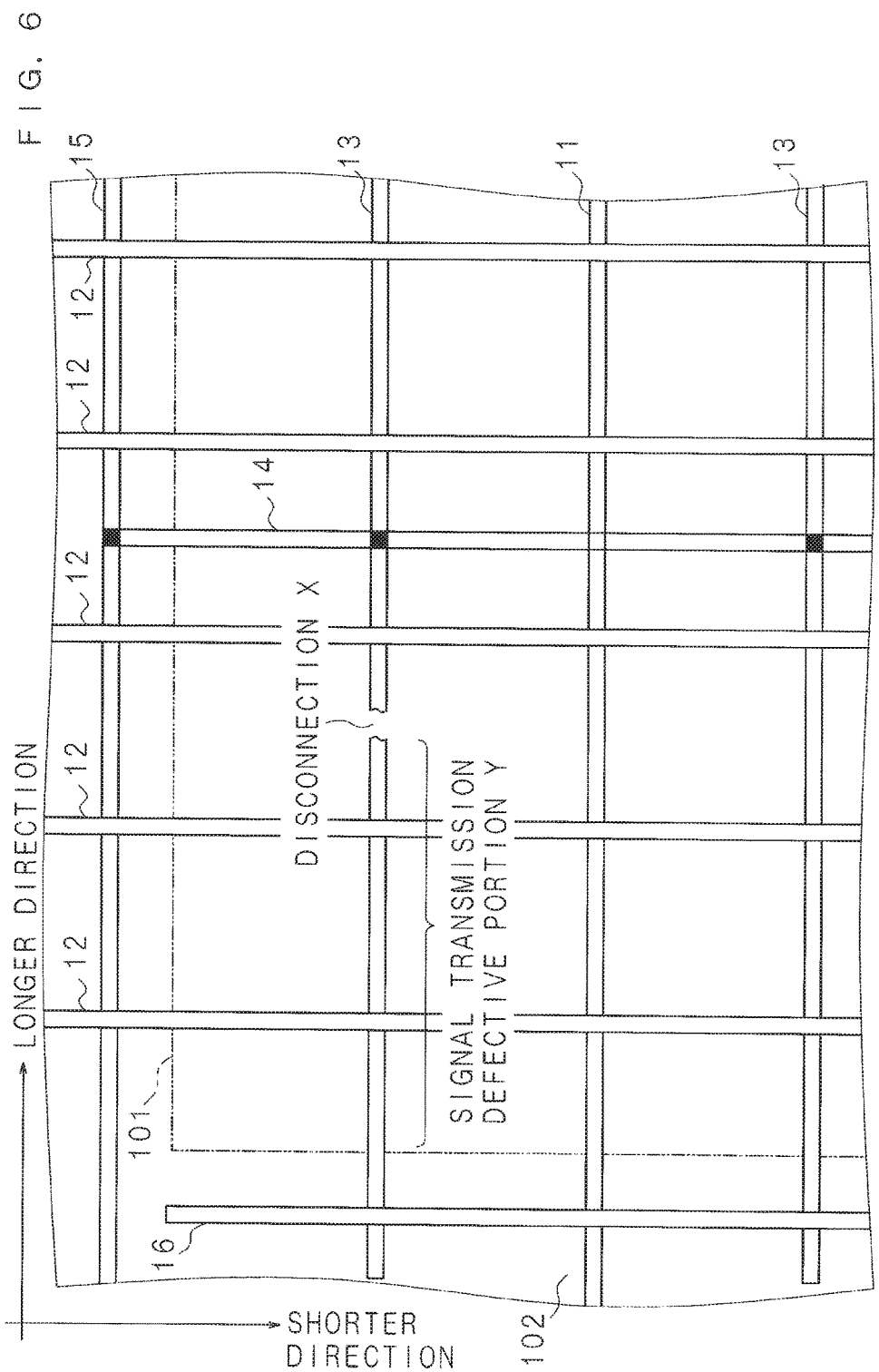
FIG. 6 is a view illustrating wirings and a disconnection location by enlarging a boundary portion between an active area and a frame area of a TFT substrate according to Embodiment 1 of the present invention.
Figure 7:
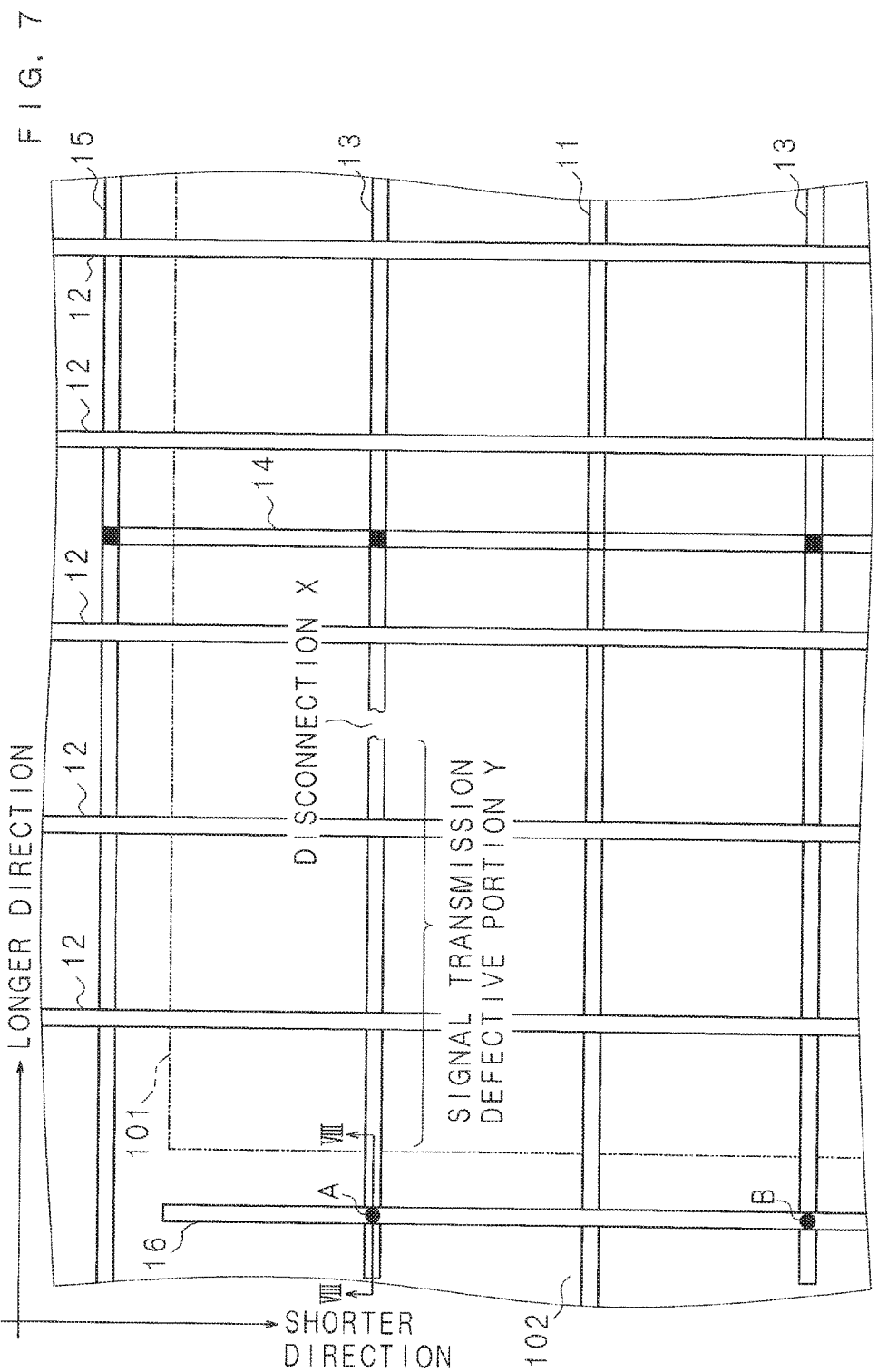
FIG. 7 is a view illustrating a method of correcting the wiring in the area of FIG. 6.

FIG. 6 is a view illustrating wirings and the disconnection location by enlarging a boundary portion between the active area 101 and the frame area 102 of the TFT substrate 100 according to Embodiment 1 of the present invention. FIG. 7 is a view illustrating a method of correcting the wiring in the area of FIG. 6. In FIGS. 6 and 7, a dashed-two dotted line represents a boundary line between the active area 101 and the frame area 102, and black-filled squares represent that the wirings are connected. Hereinafter, these are the same in the other drawings.

As illustrated in FIG. 6, when the first auxiliary capacitor wiring 13 is disconnected at a location outside from the outermost wiring among the plurality of second auxiliary capacitor wirings 14 within the display area, the outward portion from a location of the disconnection X on the first auxiliary capacitor wiring 13 becomes a signal transmission defective portion Y through which the predetermined auxiliary capacitor signal does not flow. Therefore, the predetermined auxiliary capacitor signal is not input to the auxiliary capacitor 50 connected to the signal transmission defective portion Y, and this portion appears as the display defect in the corresponding pixels.

Such a display defect may be detected by being viewed when a predetermined image for inspecting quality is displayed on the display panel 1 in an inspection process. When the display defect is detected in a part of the outermost pixel of the display panel 1, the wiring may be disconnected as illustrated in FIG. 6. In this case, by observing an area on the TFT substrate 100 corresponding to the position of the viewed display defect on the display panel 1 with, for example, a microscope, it is possible to specify the location of the disconnection X.

When the location of the disconnection X is specified, as illustrated in FIG. 7, the signal transmission defective portion Y of the first auxiliary capacitor wiring 13 having the disconnection and the auxiliary capacitor spare wiring 16 overlapped on the signal transmission defective portion Y with the insulating film 60 interposed therebetween are short-circuited at an overlapped portion A. Further, black-filed circles in FIG. 7 represent that the wirings are short-circuited. Hereinafter, these are the same in the other drawings. Next, the auxiliary capacitor spare wiring 16 and a normal first auxiliary capacitor wiring 13 overlapped on the auxiliary capacitor spare wiring 16 with the insulating film 60 interposed therebetween are short-circuited at an overlapped portion B.

FIG. 8 is a cross-sectional view taken on line VIII-VIII of FIG. 7, which illustrates a method of short-circuiting the wirings. In order to short-circuit the first auxiliary capacitor wiring 13 and the auxiliary capacitor spare wiring 16, by irradiating the insulating film 60 of the overlapped portion A with a laser beam from an outside of the TFT substrate 100 while viewing the overlapped portion A, the insulating film 60 is melted and removed. Then, in the overlapped portion A, by irradiating at least any one of the first auxiliary capacitor wiring 13 or the auxiliary capacitor spare wiring 16 with the laser beam and melting the same, a short-circuit part 62 which physically connects the first auxiliary capacitor wiring 13 and the auxiliary capacitor spare wiring 16 is formed. Also in the overlapped portion B, these wirings are short-circuited by the same processes. Further, if the normal first auxiliary capacitor wiring 13 which short-circuits with the auxiliary capacitor spare wiring 16 is not faulty, any of the first auxiliary capacitor wiring 13 may be selected. Preferably, in order to reduce an electrical resistance by shortening a transmission path, the nearest first auxiliary capacitor wiring 13 is selected.

By the above-described configuration and processes, it is possible to transmit a predetermined auxiliary capacitor signal to the signal transmission defective portion Y, by bypassing the location of the disconnection X via the auxiliary capacitor spare wiring 16. Therefore, a predetermined auxiliary capacitor signal is input to the auxiliary capacitor connected to the signal transmission defective portion Y to correct the display defect.

A plurality of second auxiliary capacitor wirings 14 are arranged within the active area 101. Therefore, when a disconnection location of the first auxiliary capacitor wiring 13 is present inside from the outermost wiring among the plurality of second auxiliary capacitor wirings 14 within the active area 101, the first auxiliary capacitor wiring 13 having the disconnection is connected to the second auxiliary capacitor wiring 14 together at segments on both sides of the disconnection location. As a result, a defect in transmission of an auxiliary capacitor signal does not occur, and a display defect does not appear. Similarly, when a disconnection occurs in the second auxiliary capacitor wiring 14, a defect in transmission of the auxiliary capacitor signal does not occur, and a display defect does not appear. Because the second auxiliary capacitor wiring 14 is connected to the first auxiliary capacitor wiring 13 or the stem line 15 for the auxiliary capacitor wirings on both sides of the disconnection location.

When the stem line 15 for the auxiliary capacitor wirings is disconnected at a location inside from the outermost wiring among the plurality of second auxiliary capacitor wirings 14, an alternative path bypassing the disconnection location is formed by two second auxiliary capacitor wirings 14 connected on both sides of the disconnection location, and the first auxiliary capacitor wiring 13 connected with both of these two second auxiliary capacitor wirings 14.

Therefore, a defect in transmission of an auxiliary capacitor signal does not occur, and a display defect does not appear.

Modified Example of Embodiment 1

Figure 9:
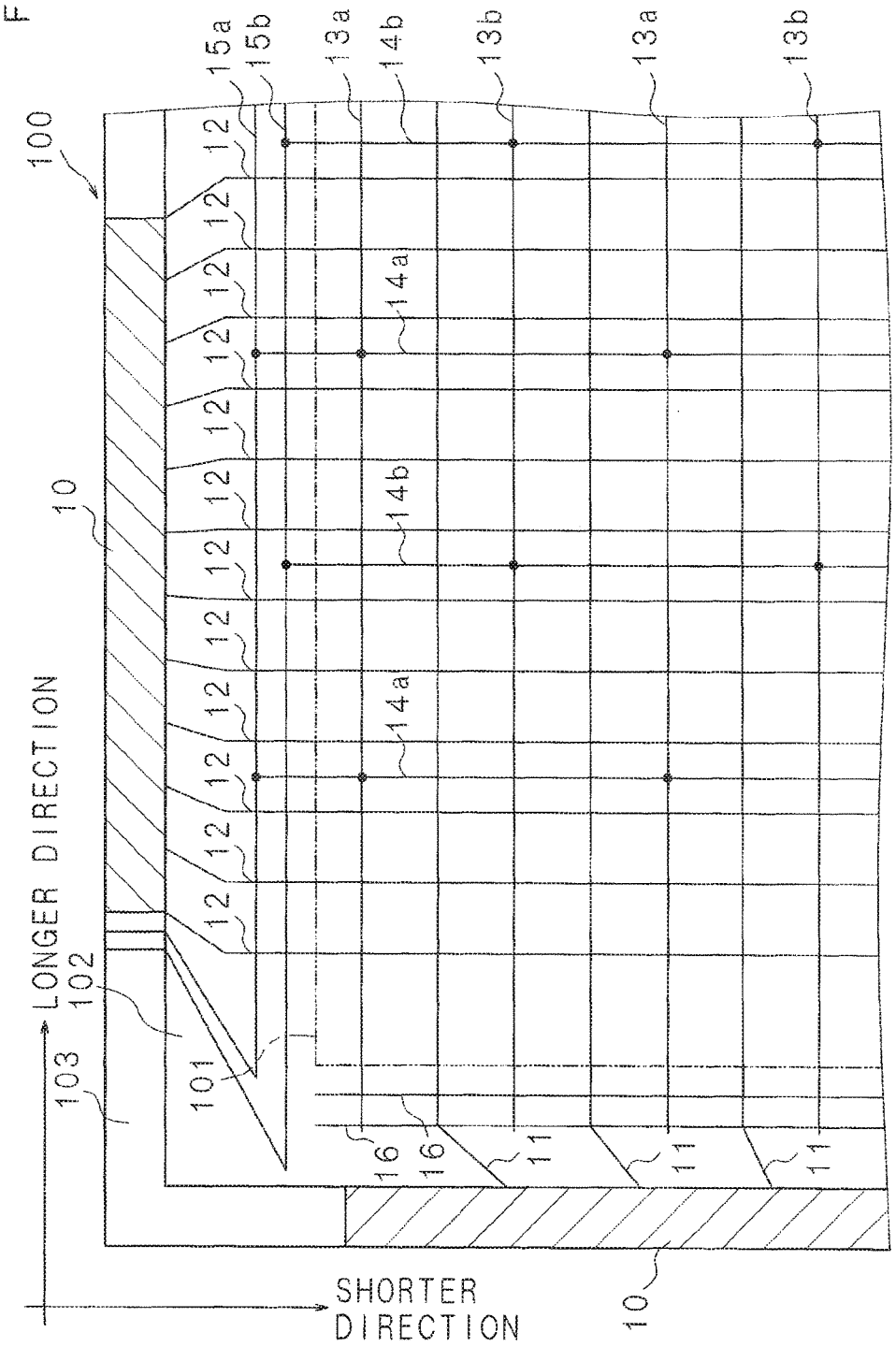
FIG. 9 is a schematic view of a TFT substrate of a display panel 1 according to a modified example of Embodiment 1 of the present invention.

Hereinafter, characteristics different from Embodiment 1 in the modified example of Embodiment 1 of the present invention will be described. The components common to Embodiment 1 are denoted by the same reference numerals and will not be described in detail. FIG. 9 is a schematic view of a TFT substrate 100 of a display panel 1 according to the modified example of Embodiment 1. In the modified example of Embodiment 1, as illustrated in FIG. 9, two stem lines 15a and 15b for the auxiliary capacitor wirings are arranged. In addition, two auxiliary capacitor spare wirings 16 are arranged. The two stem lines 15a and 15b for the auxiliary capacitor wirings may transmit auxiliary capacitor signals different from each other.

Among a plurality of second auxiliary capacitor wirings 14a and 14b, the second auxiliary capacitor wiring 14a is connected to the stem line 15a for the auxiliary capacitor wirings, and the second auxiliary capacitor wiring 14b is connected to the stem line 15b for the auxiliary capacitor wirings. In FIG. 9, these wirings are alternately connected to the stem lines 15a and 15b for the auxiliary capacitor wirings. Therefore, the second auxiliary capacitor wirings 14a and 14b may transmit auxiliary capacitor signals different from each other.

Further, among a plurality of first auxiliary capacitor wirings 13a and 13b, the first auxiliary capacitor wiring 13a is connected to all the second auxiliary capacitor wirings 14a, and the first auxiliary capacitor wiring 13b is connected to the second auxiliary capacitor wirings 14b. In FIG. 9, these wirings are alternately connected to the second auxiliary capacitor wirings 14a and 14b. Therefore, the first auxiliary capacitor wirings 13a and 13b may transmit signals different from each other, and auxiliary capacitor signals different from each other may be input to the auxiliary capacitors 50 respectively connected thereto.

Figure 10:
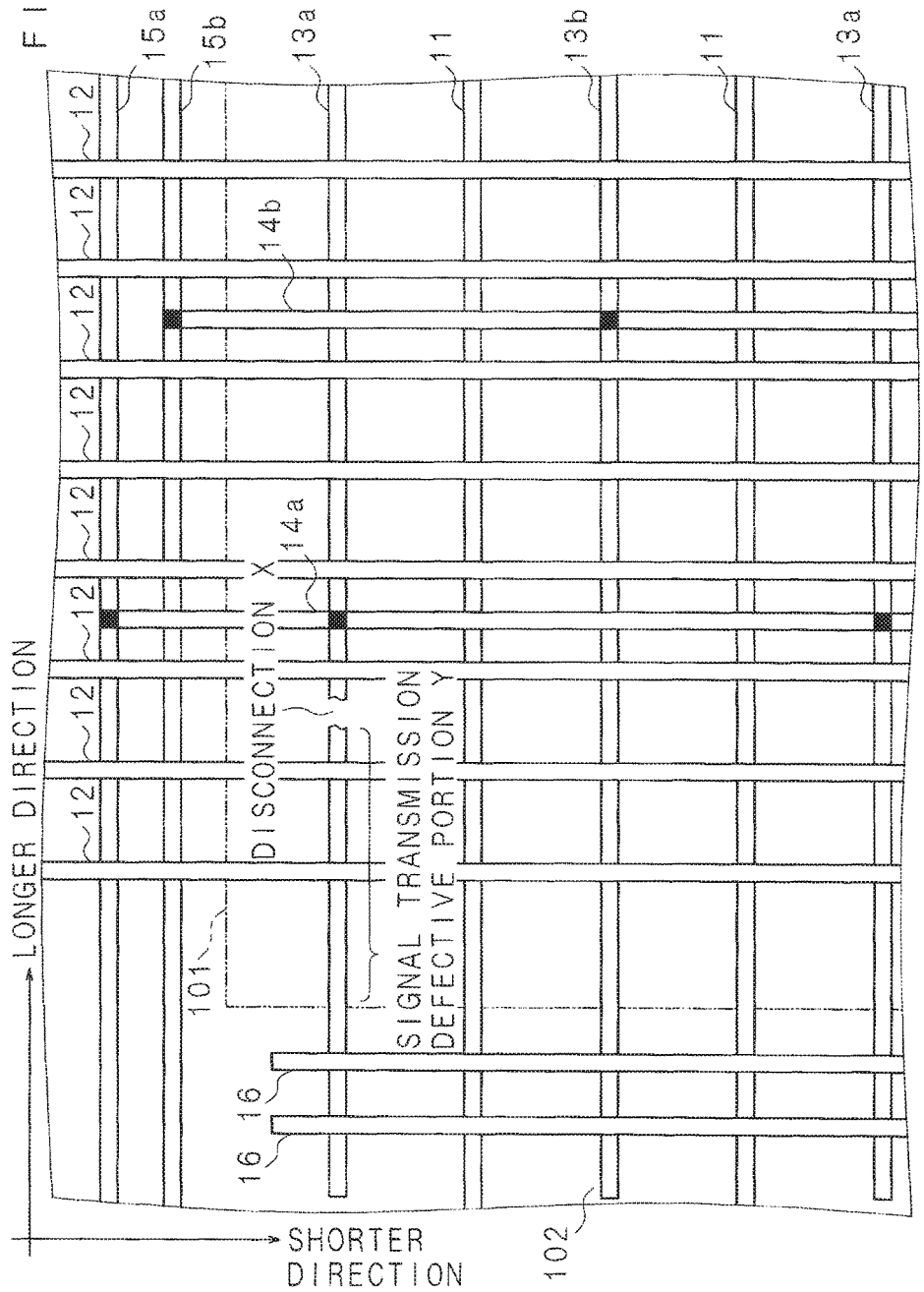
FIG. 10 is a view illustrating the wirings and disconnection location by enlarging the boundary portion between the active area and the frame area of the TFT substrate according to the modified example of Embodiment 1 of the present invention.
Figure 11:
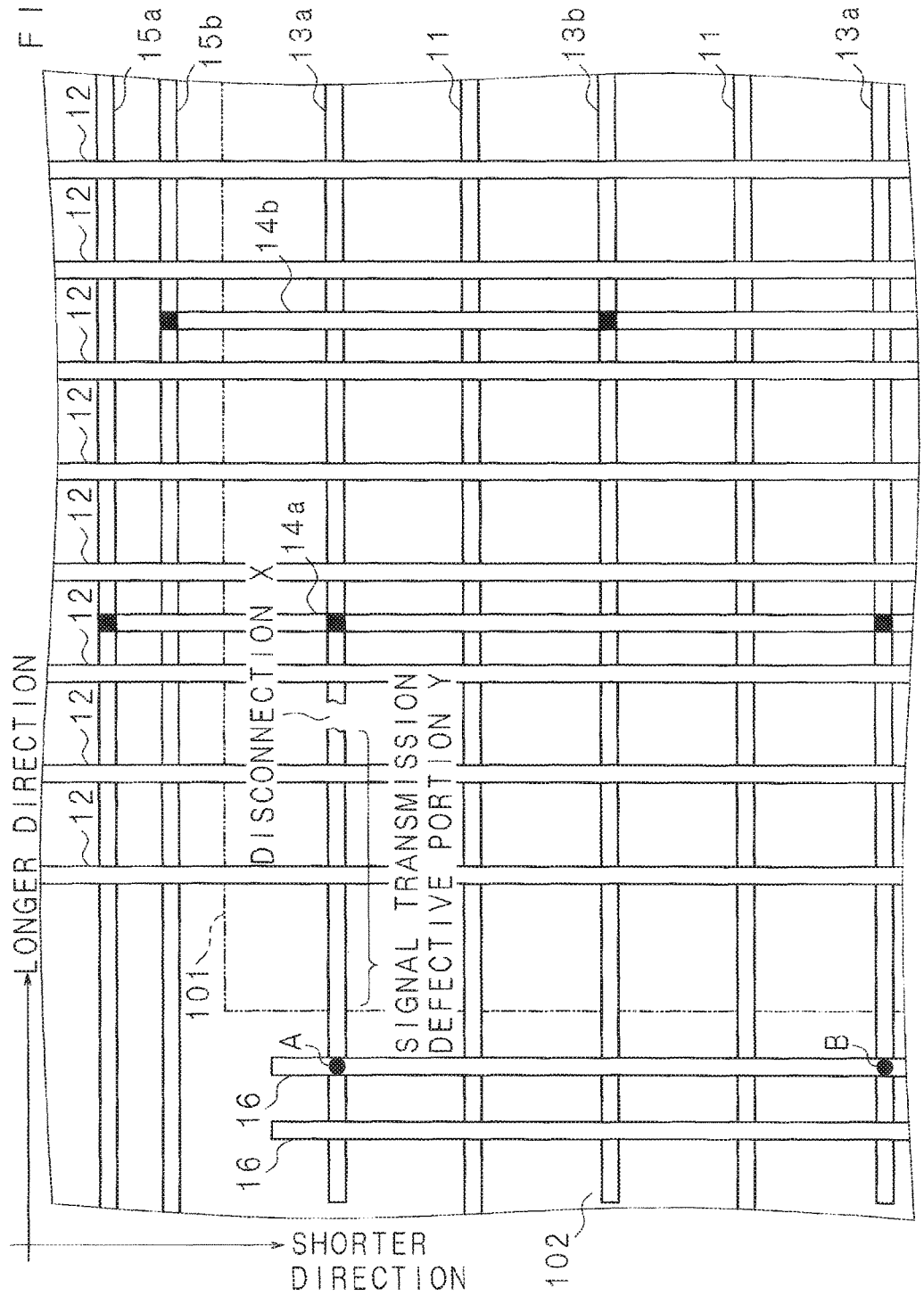
FIG. 11 is a view illustrating a method of correcting a wiring in the area of FIG. 10.

FIG. 10 is a view illustrating the wirings and disconnection location by enlarging the boundary portion between the active area 101 and the frame area 102 of the TFT substrate 100 according to the modified example of Embodiment 1 of the present invention. FIG. 11 is a view illustrating a method of correcting a wiring in the area of FIG. 10. As illustrated in FIG. 10, when a disconnection X is present in the first auxiliary capacitor wiring 13a at the location outside from the outermost wiring 14a among the plurality of second auxiliary capacitor wirings within the active area 101, the outward portion from the location of the disconnection X on the first auxiliary capacitor wiring 13a becomes the signal transmission defective portion Y through which a predetermined auxiliary capacitor signal does not flow. Since a predetermined auxiliary capacitor signal is not input to the auxiliary capacitor 50 connected to the signal transmission defective portion Y, this portion appears as the display defect in the corresponding pixels.

In this case, as illustrated in FIG. 11, in an overlapped portion A, the signal transmission defective portion Y of the first auxiliary capacitor wiring 13a having the disconnection and any of the auxiliary capacitor spare wirings 16 overlapped on the signal transmission defective portion Y with the insulating film 60 interposed therebetween are short-circuited at the overlapped portion A. Next, the auxiliary capacitor spare wiring 16 and a normal first auxiliary capacitor wiring 13a which is overlapped on the auxiliary capacitor spare wiring 16 with the insulating film 60 interposed therebetween and transmits the same signal as the first auxiliary capacitor wiring 13a having the disconnection are short-circuited at an overlapped portion B. The method of specifying a location of the disconnection X, and the method of short-circuiting the wirings are the same as those of Embodiment 1, and therefore will not be described.

By the above-described configuration and processes, it is possible to transmit a predetermined auxiliary capacitor signal to the signal transmission defective portion Y, by bypassing the location of the disconnection X via the auxiliary capacitor spare wiring 16. Therefore, a predetermined auxiliary capacitor signal is input to the auxiliary capacitor 50 connected to the signal transmission defective portion Y to correct the display defect.

In the modified example of Embodiment 1, since a plurality of auxiliary capacitor spare wirings 16 are arranged, when a disconnection is formed in the plurality of first auxiliary capacitor wirings 13 which transmit auxiliary capacitor signals different from each other, the display defects caused by the respective disconnections may be corrected by using the respective auxiliary capacitor spare wirings 16. In other words, it is possible to cope with the disconnections of first auxiliary capacitor wirings 13 which transmit auxiliary capacitor signals different from each other up to the same number as the number of the arranged auxiliary capacitor spare wirings 16.

Further, in the modified example of Embodiment 1, the case, in which two stem lines 15 for the auxiliary capacitor wirings and two auxiliary capacitor spare wirings 16 are arranged, is exemplified, but it is not limited thereto. The number thereof may be three or more. In addition, the number of the stem lines 15 for the auxiliary capacitor wirings and the auxiliary capacitor spare wirings 16 is not limited to the case of having the same number as each other.

Embodiment 2

Figure 12:
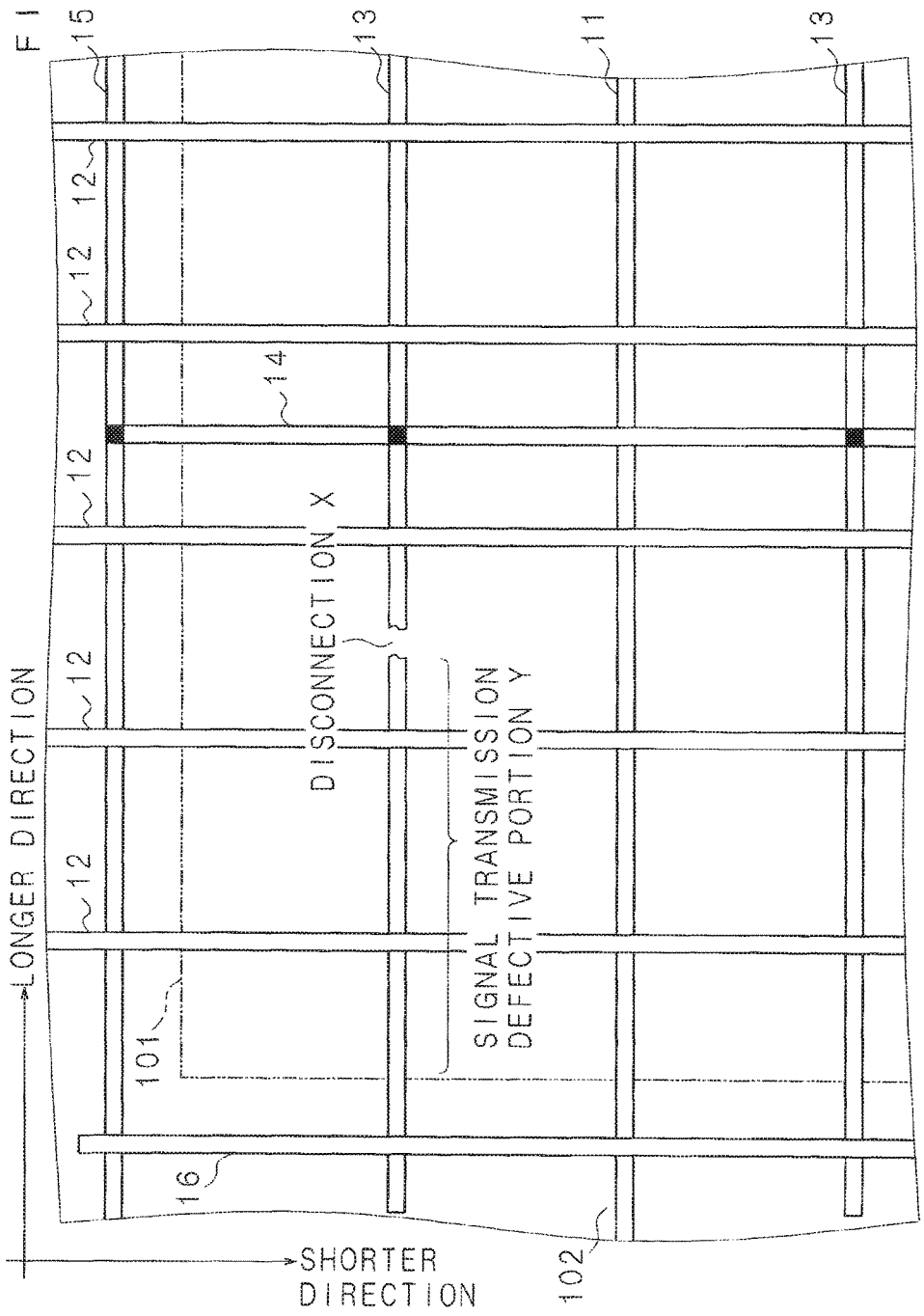
FIG. 12 is a view illustrating wirings and a disconnection location by enlarging the boundary portion between the active area and the frame area of a TFT substrate according to Embodiment 2 of the present invention.
Figure 13:
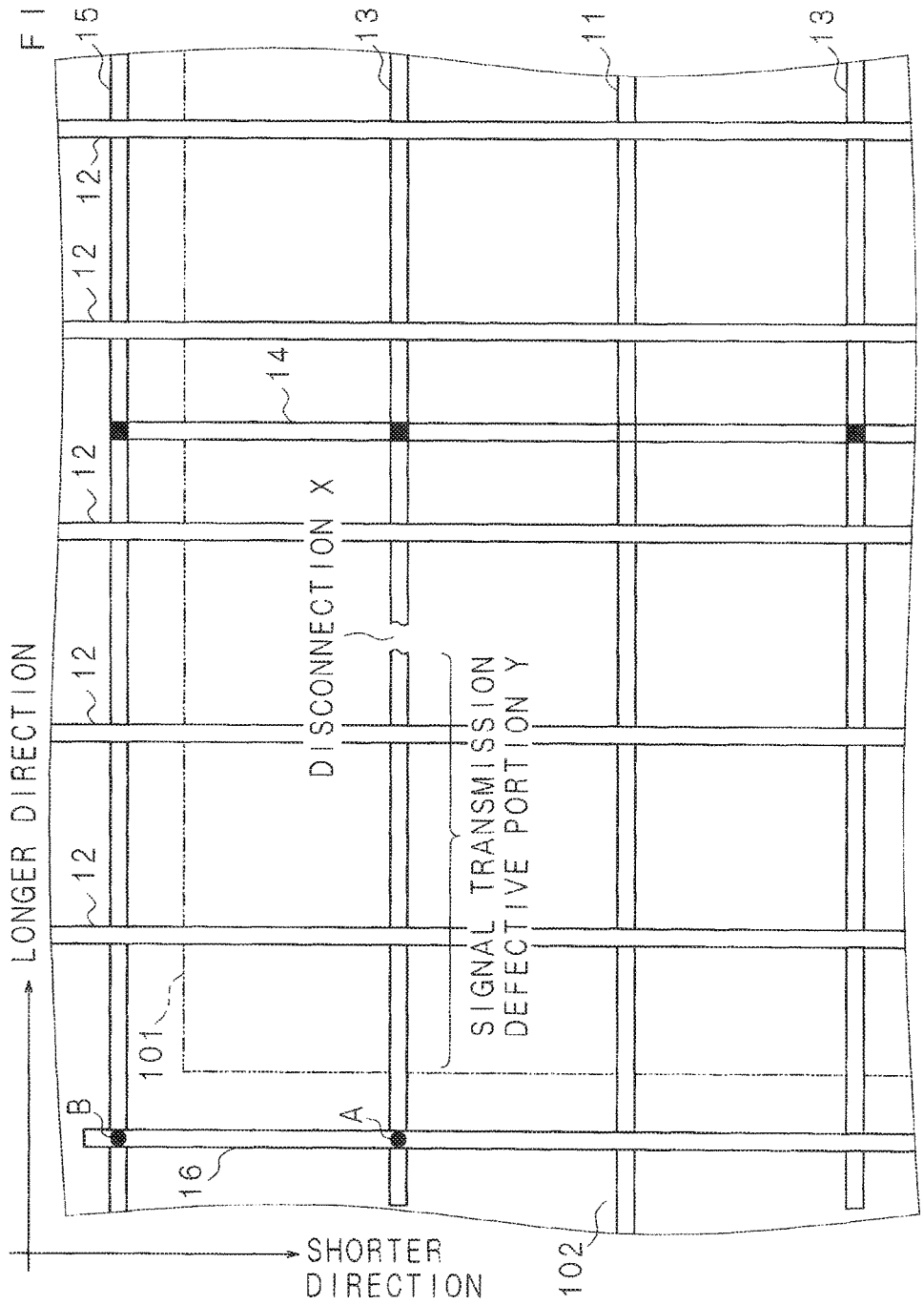
FIG. 13 is a view illustrating a method of correcting a wiring in the area of FIG. 12.

Hereinafter, characteristics different from Embodiment 1 in Embodiment 2 of the present invention will be described. The components common to Embodiment 1 are denoted by the same reference numerals and will not be described in detail. FIG. 12 is a view illustrating wirings and a disconnection location by enlarging the boundary portion between the active area 101 and the frame area 102 of a TFT substrate 100 according to Embodiment 2 of the present invention. FIG. 13 is a view illustrating a method of correcting a wiring in the area of FIG. 12.

As illustrated in FIG. 12, in the present embodiment, the auxiliary capacitor spare wiring 16 is overlapped on the stem line 15 for the auxiliary capacitor wirings at the frame area 102. When the first auxiliary capacitor wiring 13 is disconnected at the location outside from the outermost wiring among the plurality of second auxiliary capacitor wirings 14 within the display area, the outward portion from the location of the disconnection X on the first auxiliary capacitor wiring 13 becomes the signal transmission defective portion Y through which a predetermined auxiliary capacitor signal does not flow. Therefore, a predetermined auxiliary capacitor signal is not input to the auxiliary capacitor 50 connected to the signal transmission defective portion Y, and this portion appears as the display defect in the corresponding pixels.

In this case, as illustrated in FIG. 13, the signal transmission defective portion Y of the first auxiliary capacitor wiring 13 having the disconnection and the auxiliary capacitor spare wiring 16 overlapped on the signal transmission defective portion Y with the insulating film 60 interposed therebetween are short-circuited at an overlapped portion A. Next, the auxiliary capacitor spare wiring 16 and the stem line 15 for the auxiliary capacitor wirings which transmits the same signal as the first auxiliary capacitor wiring 13 having the disconnection are short-circuited at an overlapped portion B. The method of specifying a location of the disconnection X, and the method of short-circuiting the wirings are the same as those of Embodiment 1, and therefore will not be described.

By the above-described configuration and processes, it is possible to transmit a predetermined auxiliary capacitor signal to the signal transmission defective portion Y, by bypassing the location of the disconnection X via the auxiliary capacitor spare wiring 16. Therefore, a predetermined auxiliary capacitor signal is input to the auxiliary capacitor 50 connected to the signal transmission defective portion Y to resolve the display defect.

Figure 14:
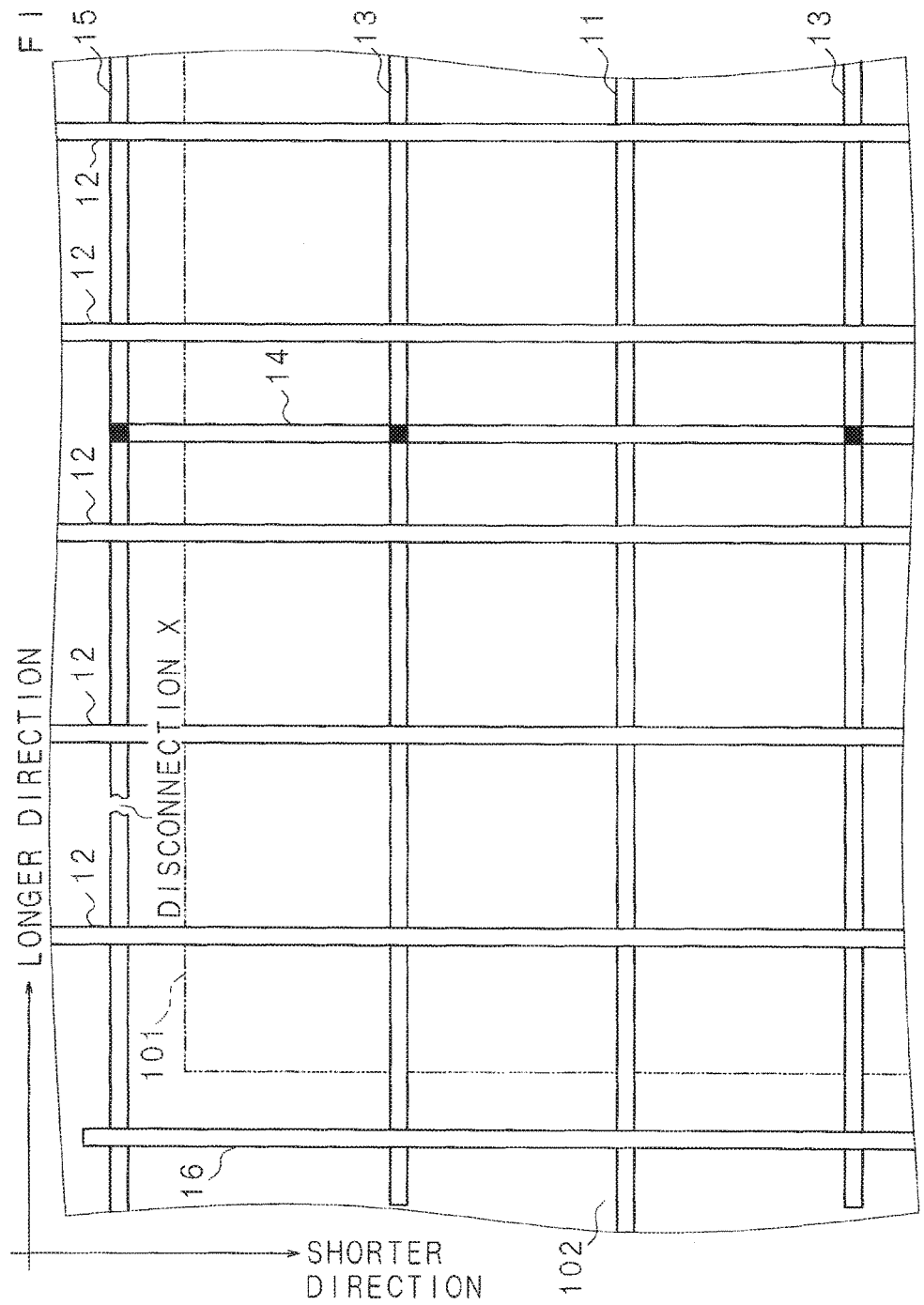
FIG. 14 is a view illustrating a disconnection of a stem line for the auxiliary capacitor wirings by enlarging the boundary portion between the active area and the frame area of the TFT substrate according to Embodiment 2 of the present invention.
Figure 15:
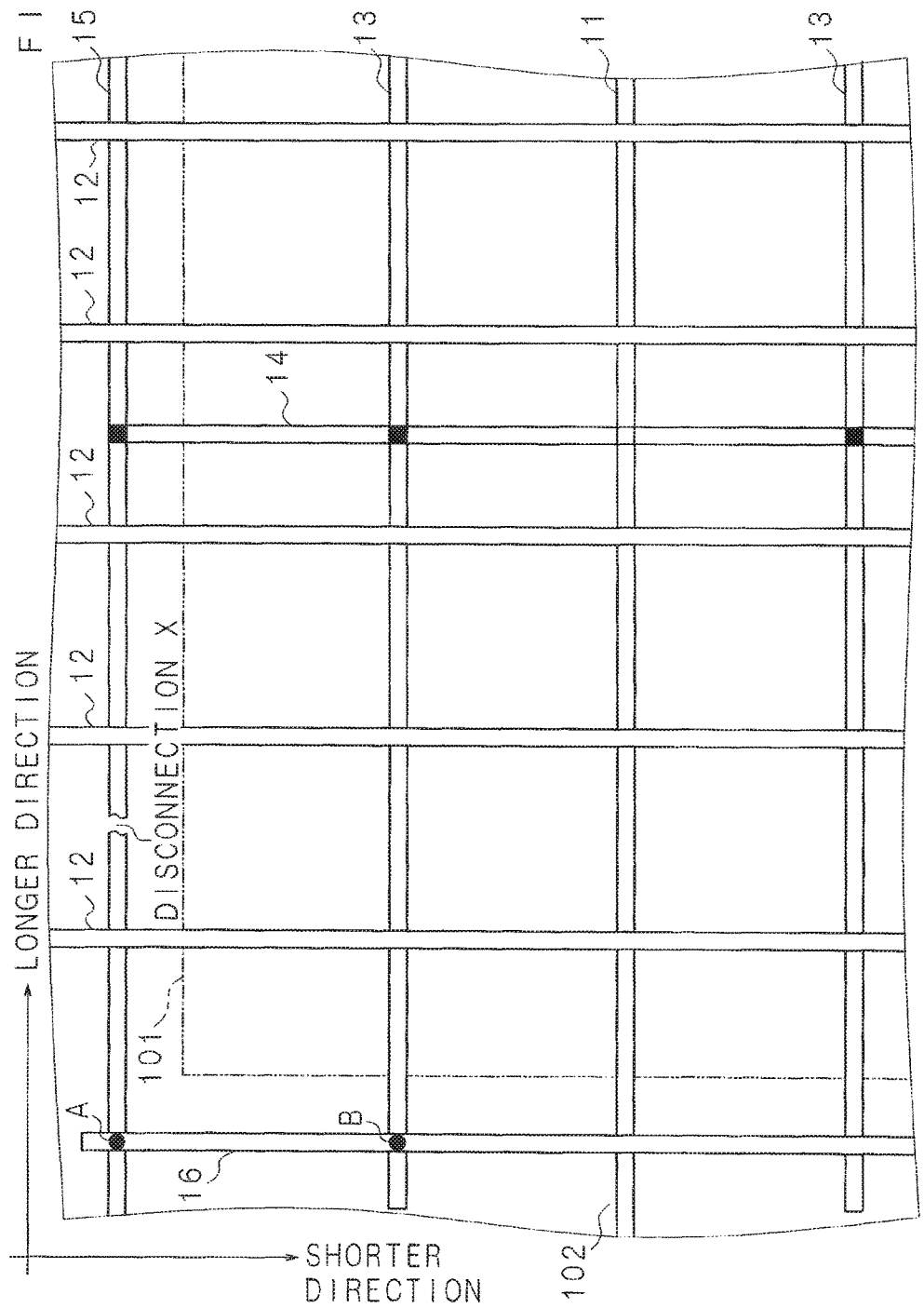
FIG. 15 is a view illustrating a method of correcting a wiring in the area of FIG. 14.

FIG. 14 is a view illustrating the disconnection of the stem line 15 for the auxiliary capacitor wirings by enlarging the boundary portion between the active area 101 and the frame area 102 of the TFT substrate 100 according to Embodiment 2 of the present invention. FIG. 15 is a view illustrating a method of correcting a wiring in the area of FIG. 14. As illustrated in FIG. 14, when the stem line 15 for the auxiliary capacitor wirings is disconnected at the location outside from the outermost wiring among the plurality of second auxiliary capacitor wirings 14, and the location of the disconnection X is present upstream from the second auxiliary capacitor wiring 14 in the direction in which the signal is transmitted, an auxiliary capacitor signal is not transmitted to all the auxiliary capacitors 50 connected to the stem line 15 for the auxiliary capacitor wirings having the disconnection X through the second auxiliary capacitor wiring 14 and the first auxiliary capacitor wiring 13. Therefore, the display defect appears in the display panel 1 across a wide range.

Such a display defect may be detected by being viewed when a predetermined image for inspecting quality is displayed on the display panel 1 in the inspection process. When the display defect is detected in the display panel 1 across a wide range, the stem line 15 for the auxiliary capacitor wirings may be disconnected as illustrated in FIG. 14. In this case, by observing an upstream portion of the stem line 15 for the auxiliary capacitor wirings on the TFT substrate 100 with, for example, a microscope, it is possible to specify the location of disconnection X.

When the location of the disconnection X is specified, as illustrated in FIG. 15, the stem line 15 for the auxiliary capacitor wirings having the disconnection X and the auxiliary capacitor spare wiring 16 overlapped on the stem line 15 for the auxiliary capacitor wirings with the insulating film 60 interposed therebetween are short-circuited at an overlapped portion A. Next, the auxiliary capacitor spare wiring 16 and a normal first auxiliary capacitor wiring 13 which is overlapped on the auxiliary capacitor spare wiring 16 with the insulating film 60 interposed therebetween, and is connected to the stem line 15 for the auxiliary capacitor wirings having the disconnection X through the second auxiliary capacitor wiring 14 are short-circuited at an overlapped portion B. The method of short-circuiting the wirings is the same as that of Embodiment 1, and therefore will not be described.

By the above-described configuration and processes, it is possible to transmit a predetermined auxiliary capacitor signal to all the auxiliary capacitors 50 connected to the stem line 15 for the auxiliary capacitor wirings having the disconnection X through the second auxiliary capacitor wiring 14 and the first auxiliary capacitor wiring 13, by bypassing the location of the disconnection X via the auxiliary capacitor spare wiring 16. Therefore, the display defect is corrected.

As described above, in the present embodiment, it is possible to correct the wirings coping with not only the disconnection on the first auxiliary capacitor wiring 13, but also the disconnection on the stem line 15 for the auxiliary capacitor wirings by the auxiliary capacitor spare wiring 16.

Further, in the present embodiment, the case, in which one stem line 15 for the auxiliary capacitor wirings and one auxiliary capacitor spare wiring 16 are arranged, is exemplified, but it is not limited thereto. Two or more of stem lines for the auxiliary capacitor wirings and auxiliary capacitor spare wirings may be arranged, and furthermore, the numbers thereof may be different from each other.

Embodiment 3

Figure 16:
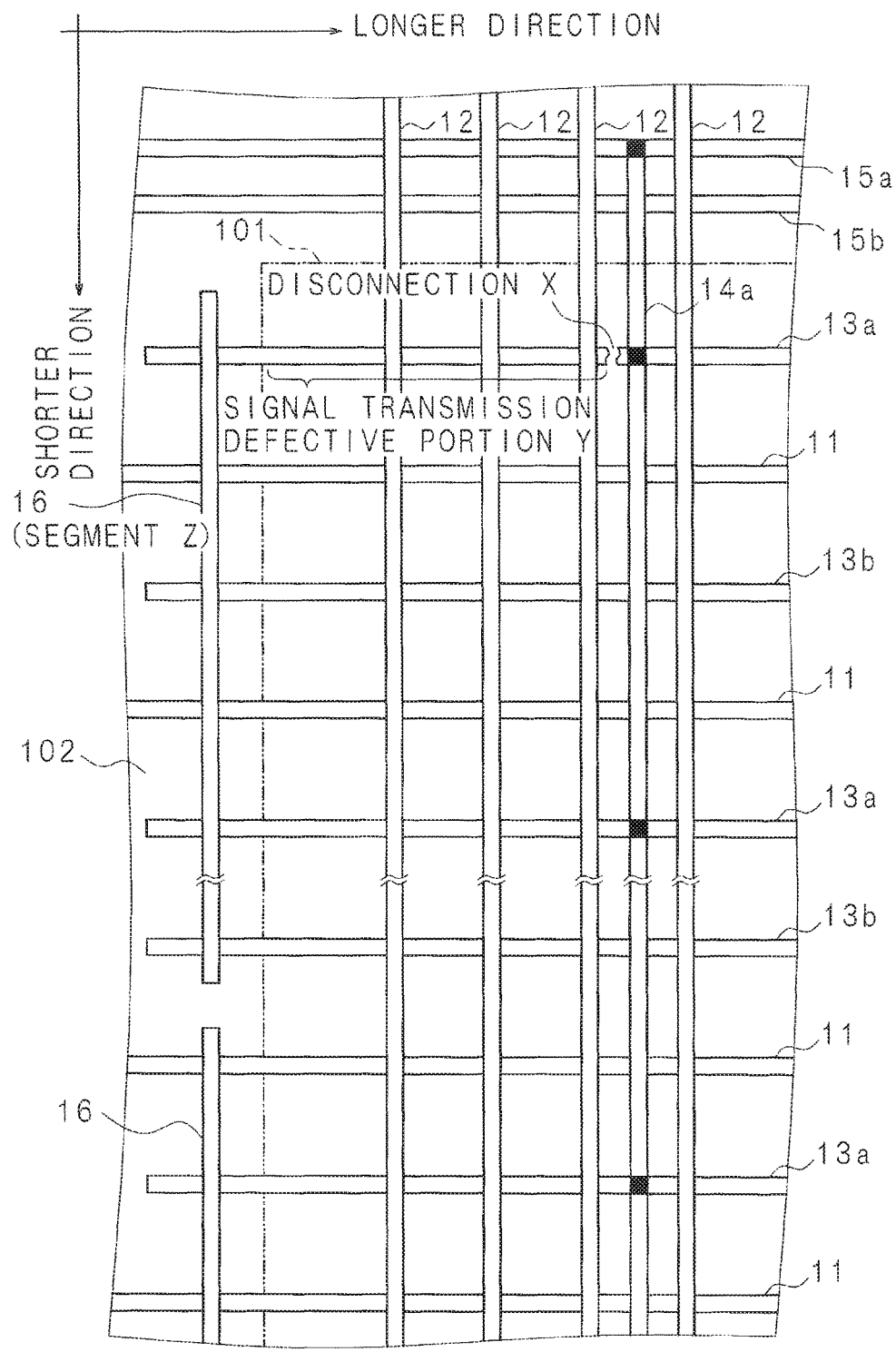
FIG. 16 is a view illustrating wirings and a disconnection location by enlarging the boundary portion between the active area and the frame area of a TFT substrate according to Embodiment 3 of the present invention.
Figure 17:
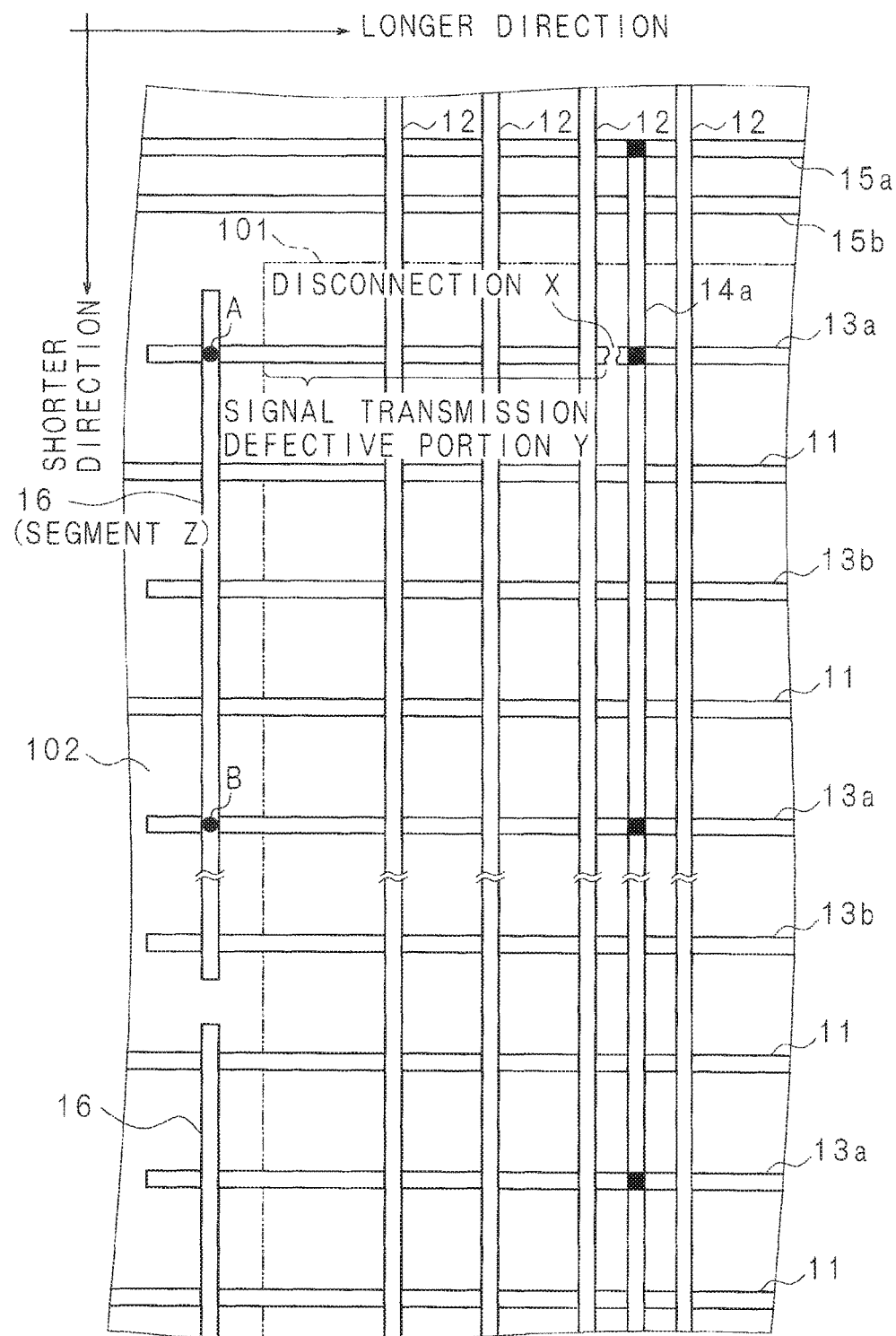
FIG. 17 is a view illustrating a method of correcting a wiring in the area of FIG. 16.

Hereinafter, characteristics different from Embodiments 1 and 2 in Embodiment 3 of the present invention will be described. The components common to Embodiments 1 and 2 are denoted by the same reference numerals and will not be described in detail. FIG. 16 is a view illustrating wirings and a disconnection location by enlarging the boundary portion between the active area 101 and the frame area 102 of a TFT substrate 100 according to Embodiment 3 of the present invention. FIG. 17 is a view illustrating a method of correcting a wiring in the area of FIG. 16.

As illustrated in FIG. 16, in the present embodiment, the auxiliary capacitor spare wiring 16 is arranged by dividing it into a plurality of segments. When the first auxiliary capacitor wiring 13a is disconnected at the location outside from the outermost wiring 14a among the plurality of second auxiliary capacitor wirings within the display area, the outward portion from the location of the disconnection X on the first auxiliary capacitor wiring 13a becomes the signal transmission defective portion Y through which a predetermined auxiliary capacitor signal does not flow. Therefore, a predetermined auxiliary capacitor signal is not input to the auxiliary capacitor 50 connected to the signal transmission defective portion Y, and this portion appears as the display defect in the corresponding pixels.

In this case, as illustrated in FIG. 17, in an overlapped portion A, the signal transmission defective portion Y of the first auxiliary capacitor wiring 13a having the disconnection and a segment Z of the auxiliary capacitor spare wiring 16 overlapped on the signal transmission defective portion Y with the insulating film 60 interposed therebetween are short-circuited at the overlapped portion A. Next, the segment Z and a normal first auxiliary capacitor wiring 13a which is overlapped on the segment Z with the insulating film 60 interposed therebetween and transmits the same signal as the first auxiliary capacitor wiring 13a having the disconnection X are short-circuited at an overlapped portion B. The method of specifying a location of the disconnection X, and the method of short-circuiting the wirings are the same as those of Embodiment 1, and therefore will not be described.

By the above-described configuration and processes, it is possible to transmit a predetermined auxiliary capacitor signal to the signal transmission defective portion Y, by bypassing the location of the disconnection X via the segment Z of the auxiliary capacitor spare wiring 16. Therefore, a predetermined auxiliary capacitor signal is input to the auxiliary capacitor 50 connected to the signal transmission defective portion Y to correct the display defect.

In the present embodiment, since one auxiliary capacitor spare wiring 16 is divided into a plurality of segments, even when using one segment in correction of the disconnection of one location, another segment may be used in correction of the disconnection of the other location. For example, at a location separated from the location of disconnection X, when a first auxiliary capacitor wiring 13b, which transmits an auxiliary capacitor signal different from an auxiliary capacitor signal transmitted by the first auxiliary capacitor wiring 13a having the disconnection X, is disconnected at the location outside from the outermost wiring among the plurality of second auxiliary capacitor wirings 14, it is possible to correct the wiring by using another segment different from the segment Z. As compared with the modified example of Embodiment 1, there is no need to arrange a plurality of auxiliary capacitor spare wirings 16 in parallel to each other, and an area required for arranging the auxiliary capacitor spare wiring 16 may be decreased. Therefore, it is possible to narrowly form the frame area 102, and improve the appearance quality of a display apparatus on which the display panel 1 of the present embodiment is mounted.

Further, in the present embodiment, the case, in which two stem lines for the auxiliary capacitor wirings and one auxiliary capacitor spare wiring 16 are arranged, is exemplified, but it is not limited thereto. One or three or more of stem lines for the auxiliary capacitor wirings may be arranged, and two or more of auxiliary capacitor spare wirings 16 may be arranged.

Further, in each of the above-described embodiments, the configuration, in which the common electrode is formed on the opposite substrate, is exemplified, but it is not limited to this configuration. For example, the present invention may be applied to an in-plane switching (IPS) type display panel which does not have the common electrode on the opposite substrate.

It should be understood that the embodiments disclosed herein are illustrative and non-restrictive in every respect. Since the scope of the present invention is defined by the appended claims rather than by the above description, all changes that fall within metes and bounds of the claims, or equivalence of such metes and bounds thereof are therefore intended to be embraced by the claims.

It is noted that, as used herein and in the appended claims, the singular forms "a", "an", and "the" include plural referents unless the context clearly dictates otherwise.

The invention claimed is:

1. A display panel comprising:
a substrate;
a plurality of pixel electrodes, which are disposed on the substrate in the form of a matrix, and are configured to display an image;
transistors of which drain electrodes are connected to the plurality of pixel electrodes, respectively;
a plurality of gate wirings which are arranged on the substrate along a first direction of the matrix, and are respectively connected to gate electrodes of the transistors to supply a gate signal;
a plurality of source wirings which are arranged on the substrate along a second direction crossing the first direction, and are respectively connected to source electrodes of the transistors to supply a data signal;
a plurality of first wirings, which are arranged on the substrate along the first direction;
a plurality of second wirings, which are arranged on the substrate along the second direction, and are respectively connected with the plurality of first wirings;
at least one third wiring, which is arranged on the substrate along the first direction, and is connected with the plurality of second wirings to supply a predetermined signal to the plurality of first wirings through the plurality of second wirings;
a fourth wiring, which is arranged on the substrate along the second direction in a peripheral area surrounding an area in which the plurality of pixel electrodes are arranged, and is overlapped on the plurality of first wirings;
an insulating film configured to insulate the plurality of second wirings and the fourth wiring from the plurality of first wirings and the at least one third wiring; and
a plurality of capacitor parts,
wherein one end of each of the plurality of capacitor parts is connected to each of the plurality of pixel electrodes and the other end of each of the plurality of capacitor parts is connected to each of the plurality of first wirings, and
the plurality of first wirings and the fourth wiring are not short-circuited.

2. The display panel according to claim 1, wherein
i) the plurality of second wirings are overlapped on the plurality of first wirings and the at least one third wiring,
ii) the plurality of second wirings are respectively connected to the plurality of first wirings thereto through contact holes formed in the insulating film at portions where the plurality of second wirings are overlapped on the plurality of first wirings and the at least one third wiring, and
iii) the plurality of second wirings are connected to the at least one third wiring thereto through contact holes formed in the insulating film at portions where the plurality of second wirings are overlapped on the plurality of first wirings and the at least one third wiring.

3. The display panel according to claim 1, wherein the fourth wiring is overlapped on the at least one third wiring with the insulating film interposed therebetween.

4. The display panel according to claim 1, wherein a plurality of the at least one third wirings are arranged, and are respectively connected to the plurality of second wirings and the plurality of second wirings are respectively connected to the plurality of first wirings.

5. The display panel according to claim 1, wherein the fourth wiring is divided into a plurality of segments.

6. The display panel according to claim 1, wherein the plurality of second wirings are respectively connected to the plurality of first wirings within an area in which the plurality of pixel electrodes are arranged.

7. The display panel according to claim 1, wherein the at least one third wiring is disposed in a peripheral area surrounding an area in which the plurality of pixel electrodes are arranged.

8. The display panel according to claim 1, wherein the plurality of gate wirings are formed in the same layer as the layer in which the plurality of first wirings and the at least one third wiring are formed, and
the plurality of source wirings are formed in the same layer as the layer in which the plurality of second wirings and the fourth wiring are formed.

9. The display panel according to claim 1, wherein the plurality of second wirings are alternately connected to a first third-wiring and a second third-wiring each of which is one of the at least one third wiring.

10. The display panel according to claim 9, wherein the first third wiring and the second third wiring transmit signals different from each other.

11. The display panel according to claim 9, wherein the plurality of first wirings are alternately connected to a first second-wiring connected to the first third-wiring and a second second-wiring connected to the second third-wiring each of which is one of the plurality of second wirings.

* * * * *